United States Patent
Teich

(10) Patent No.: US 6,661,237 B2
(45) Date of Patent: Dec. 9, 2003

(54) SMART AWA

(75) Inventor: Stanley Teich, Melville, NY (US)

(73) Assignee: Northrop Grumman Corporation, Los Angeles, CA (US)

(*) Notice: Subject to any disclaimer, the term of this patent is extended or adjusted under 35 U.S.C. 154(b) by 63 days.

(21) Appl. No.: 09/964,248

(22) Filed: Sep. 26, 2001

(65) Prior Publication Data

US 2003/0057959 A1 Mar. 27, 2003

(51) Int. Cl.[7] ................................................. H04B 3/46
(52) U.S. Cl. ........................................................ 324/539
(58) Field of Search ................................ 324/538–542, 324/761–764, 66, 508, 509; 29/593

(56) References Cited

U.S. PATENT DOCUMENTS

| | | | |
|---|---|---|---|
| 4,095,719 A | * 6/1978 | Wolf | 220/4 B |
| 4,257,002 A | * 3/1981 | Helms et al. | 324/539 |
| 4,262,254 A | * 4/1981 | Poss | 324/457 |
| 4,319,193 A | 3/1982 | Boccali et al. | |
| 4,399,400 A | 8/1983 | Rockwell et al. | |
| 4,417,204 A | 11/1983 | Dehmel et al. | |
| 4,418,312 A | 11/1983 | Figler et al. | |
| 4,870,347 A | 9/1989 | Cicerone | |
| 5,072,185 A | * 12/1991 | Rockwell | 324/539 |
| 5,161,232 A | 11/1992 | Beran | |
| 5,250,908 A | 10/1993 | Liu et al. | |
| 5,430,607 A | * 7/1995 | Smith | 361/683 |
| 5,436,554 A | 7/1995 | Decker, Jr. | |
| 5,617,039 A | 4/1997 | Kuck et al. | |
| 5,798,647 A | 8/1998 | Martin et al. | |
| 5,852,796 A | 12/1998 | Stepanenko, Jr. | |
| 6,442,498 B1 | * 8/2002 | Krigel | 702/108 |

* cited by examiner

*Primary Examiner*—N. Le
*Assistant Examiner*—Amy He
(74) *Attorney, Agent, or Firm*—Stetina Brunda Garred & Brucker

(57) ABSTRACT

A smart automatic wiring analyzer having at least two modular wiring analyzer boxes stacked together is provided. The modular wiring analyzer boxes has a plurality of testing pins connected to a plurality of interface pins of at least a connector built in the smart automatic wiring analyzer. Thereby, a direct connection to the cable under test can be established without introducing an external interface fixture. A wire list of the connection between the test pins and the interface pins are pre-stored in a reference file. When a cable is to be tested, the wiring pattern of the cable is obtained by attaching a known-good cable to the connector. A test program (sequence) is generated according to the wiring pattern of the cable and the wire list. The cable can thus be tested.

16 Claims, 5 Drawing Sheets

SMART AWA

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to an automatic wiring analyzer (AWA), and more particularly to a smart automatic wiring analyzer that is portable, self-contained and applicable to test wires or harnesses in a fuel rich environment.

While performing a test or analysis on a cable or a harness, the conventional wiring analyzer is normally connected to an interface fixture such as a unique harness board containing connectors designed to interface the cable or the harness under test. The process to define how the harness board connectors are connected or attached to the wiring analyzer is done by probing each pin of the harness board connectors guided by a software. Alternatively, a keyboard entry for one pin at a time may also be applied to define the connection between the harness board pin and the pin of the wiring analyzer. In this manner, for a harness of 512 points, 512 manual steps (probing or keying) are required.

Thus, the above wiring analyzer normally has a large volume and a heavy weight applicable to bench operation only. This kind of wiring analyzer is typically rack mounted, and have to be wheeled up to a vehicle or a plane with very long cables. Further, the wiring analyzer is normally operated with a 60 Hz power and cannot be used in a fuel-rich environment.

SUMMARY OF THE INVENTION

A smart automatic wiring analyzer comprising at least two modular wiring analyzer boxes stacked together is provided. The modular wiring analyzer boxes has a plurality of testing pins connected to a plurality of interface pins of at least a connector built in the smart automatic wiring analyzer. Thereby, a direct connection to the cable under test can be established without introducing an external interface fixture. A wire list of the connection between the test pins and the interface pins is pre-stored in a reference file. When a cable is to be tested, the reference file is called up to generate a test program according to the wiring pattern of the cable. The cable can thus be tested.

The smart automatic wiring analyzer provided in the invention further comprises a transformer that can operate at either 60 Hz or 400 Hz. In addition, a military transit case can be used to house the system, therefore, it can be used in a military application. As the additional interface fixture is removed, a volume of less than 1 cubic foot and a weight of about 24 lb can be realized smart automatic wiring analyzer according to claim 1, further comprising a military transit case. Further, The smart automatic wiring analyzer may employ a filter and an EMI gasketing meet EMI/EMC requirements of the MIL-STD-461D.

In one embodiment of the invention, a method for testing whether the short circuit condition of a cable/harness is provided. A wiring analyzer with at least a built-in connector is provided. The wiring analyzer has a plurality of testing pins connected to a plurality of interface pins of the built-in connector. A reference file which contains a wire list of between the testing pins and the interface pins is called up. A known-good cable of the same kind of a cable under test is provided and hooked up to the connector to generate and save a wiring pattern of the cable under test as a test program. The cable under test is then hooked up to the connector and tested with the test program. In this method, only one end of the cable under test is hooked up to the connector. When any abnormal path exist between the wires of the cable or between the wires and the ground, as it differs from the wiring pattern in the test program, a short circuit error is displayed.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
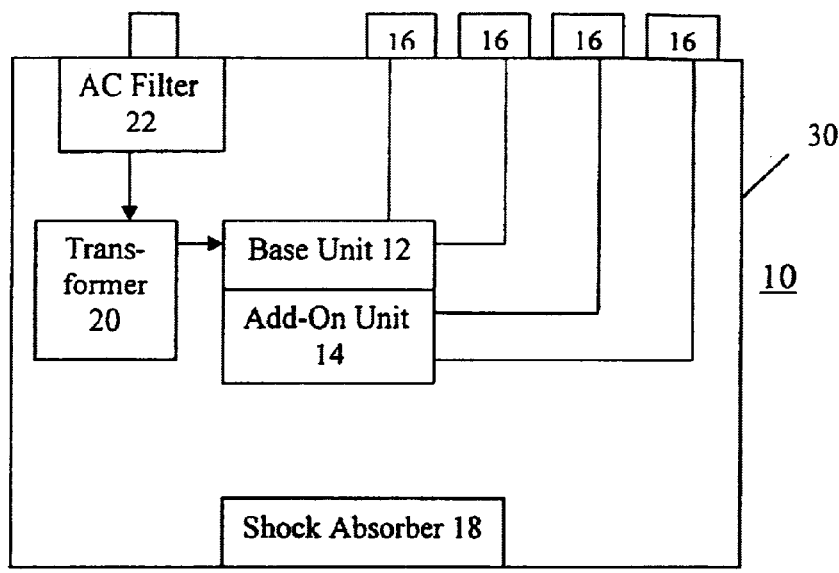
FIG. 1 is a block diagram showing circuit of the smart automatic wiring analyzer according to the invention.
Figure 2:
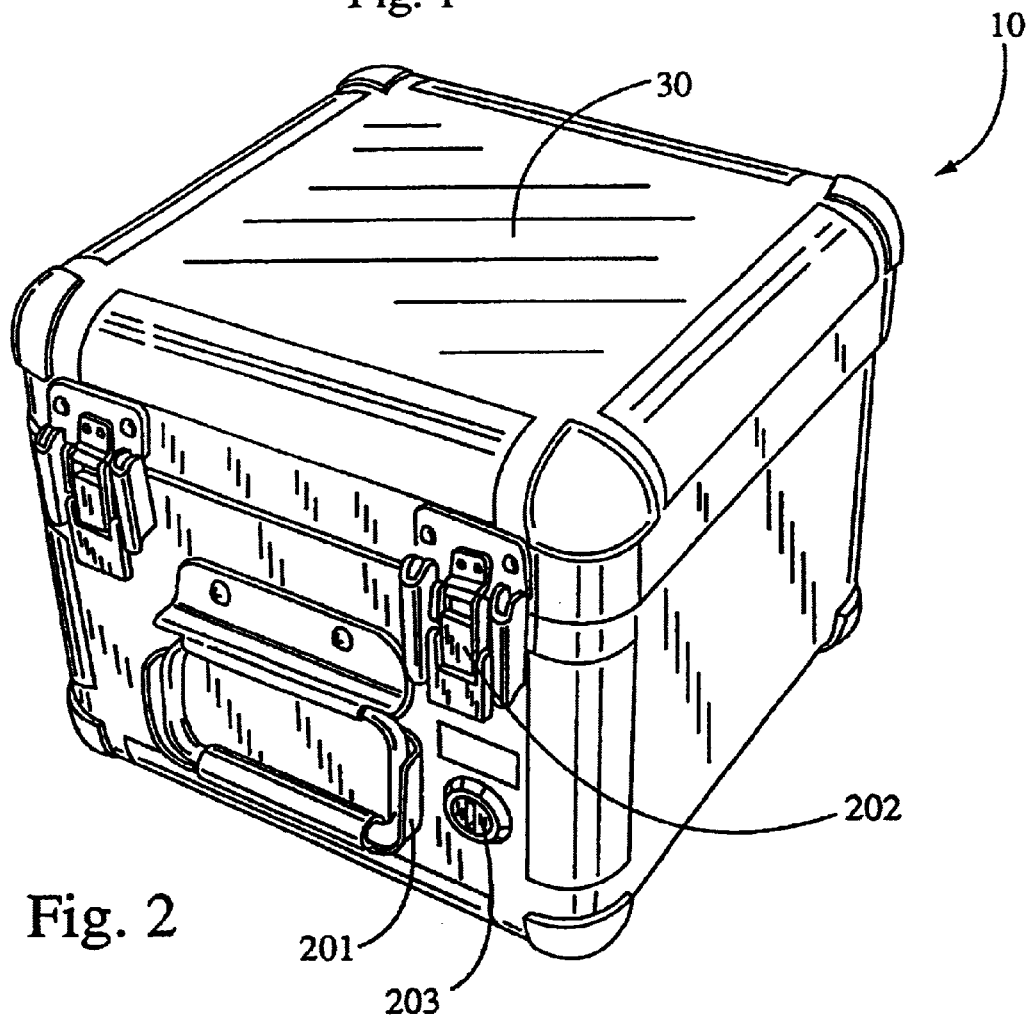
FIG. 2 shows an exterior of the automatic wiring analyzer.
Figure 3:
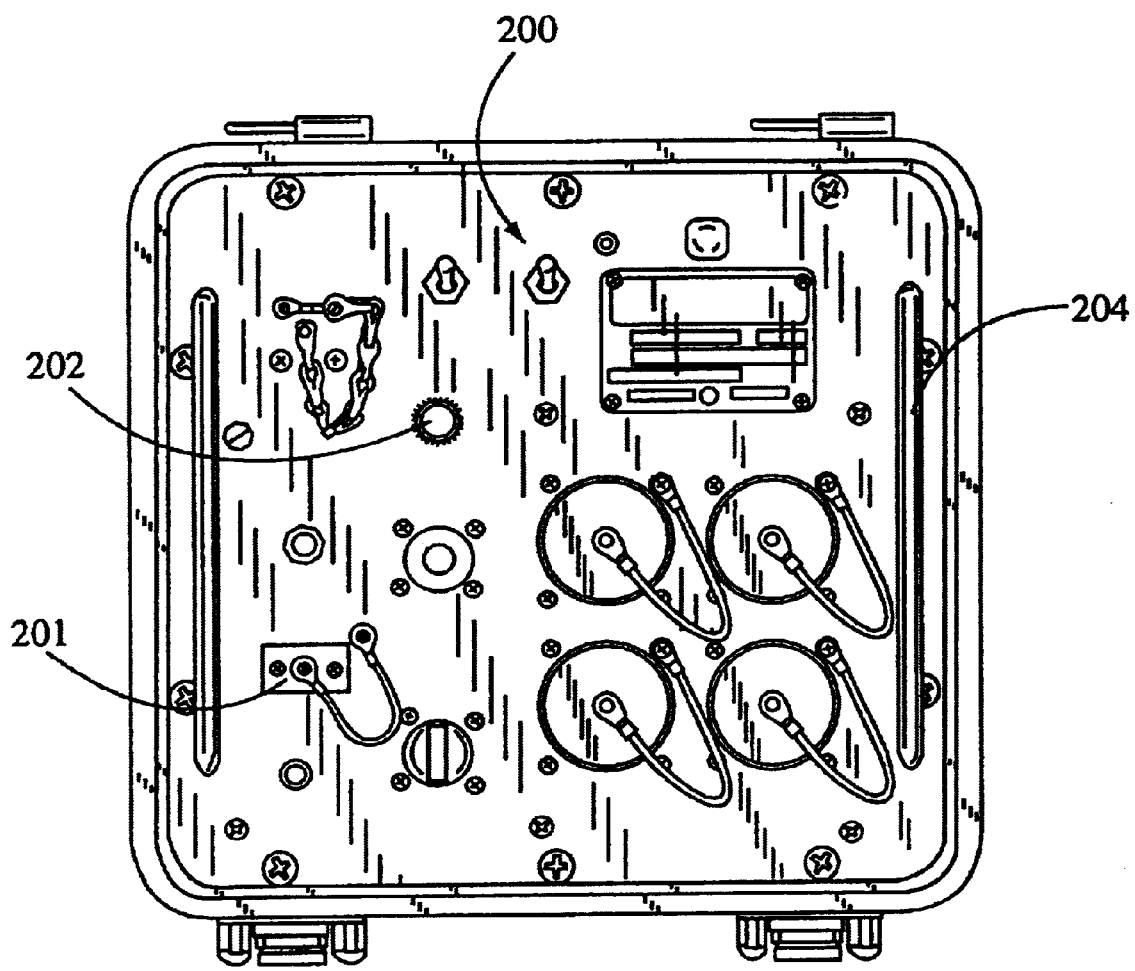
FIG. 3 shows a control panel of the smart automatic wiring.

FIG. 1 shows a block diagram of the smart automatic wiring analyzer that can be controller by a computer via an interface such as an RS-232 interface (Referring to 201 of FIG. 3). Referring to FIG. 2, the smart automatic wiring analyzer is housed in a transit case 30, preferably a military standard transit case. On the case, a handle 201 may be attached to provide the portability. Various kinds of locks 202 and 203 may be installed on the case to secure and protect the smart automatic wiring analyzer 10 therein.

Referring to FIG. 1, the smart automatic wiring analyzer 10 includes a base unit 12 and an add-on unit 14 connected with each other in a daisy chain. Both the base unit 12 and the add-on unit 14 are selected from typical modular wiring analyzer boxes, for example, the Cirris Wiring Analyzers. Each of the base unit 12 and the add-on unit 14 has a test capability of testing 256 points. That is, the smart automatic wiring analyzer 10 has the test capability of testing 512 points. It is appreciated that the number of the testing pins of the smart automatic wiring analyzer 10 can be altered and designed according to specific requirements. That is, the number and variety of the modular wiring analyzer boxes are not restricted to two Cirris Wiring Analyzers. Instead, other kinds of harness tester with different testing points may also be applied to the smart automatic wiring analyzer 10.

Instead of incorporating a harness board, as shown in FIG. 1, a plurality of I/O connectors 16 are installed on a control panel (referring to FIG. 3) of the smart automatic wiring analyzer 10. The base unit 12 and the add-on unit 14 are connected to the I/O connectors 16, which provides a direct connection between the cable or harness under test and the smart automatic wiring analyzer 10. That is, the cable or harness under test is directly connected or attached to the smart automatic wiring analyzer 10 without using a harness board as a connection interface. The wire list of how each pin of each I/O connector 16 is connected or attached to the base unit 12 and the add-on analyzer 14 is pre-stored in a database of a software file. In this embodiment, four connectors 16 selected from military I/O connectors that can be connected to various kinds of cables or harnesses under test are mounted a panel of the smart automatic wiring analyzer 10. Preferably, each of the connectors 16 has 128 interface pins.

Figure 4:
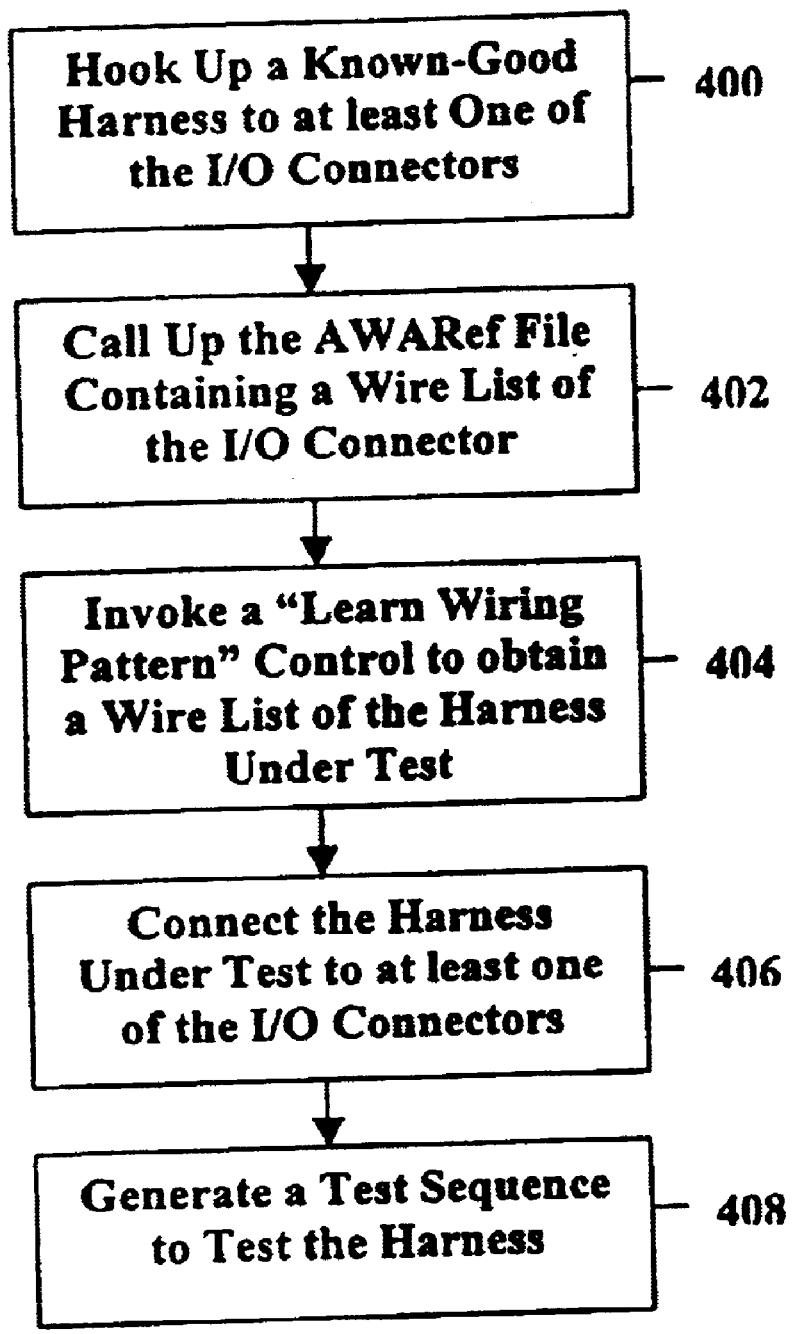
FIG. 4 shows a flow chart for testing or analyzing the cable/harness under test.

Before testing a harness or a cable, the wire list of how each interface pin of the I/O connectors is connected to the pins of the modular wiring analyzer has to be established. Otherwise, the result displayed by the tester (the wiring analyzer) is relative to the test points of the tester instead of the actual wire harness locations. FIG. 4 shows a flow chart to self-learn any harness or cable under test, a reference file (called AWARef) is created to map the interface pins of the connectors 16 to the base unit 12 or the add-on unit 14. Before introducing the self-learn program of the harness or cable under test, a process of creating the reference file AWARef is introduced in FIG. 5.

Figure 5:
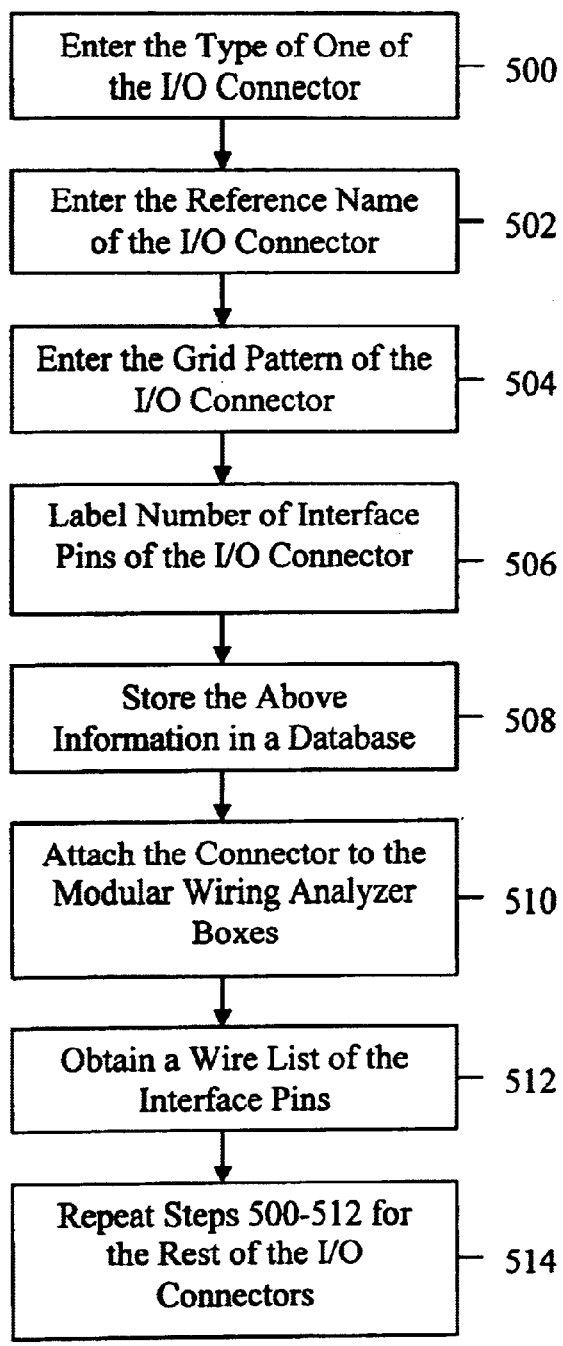
FIG. 5 shows a flow chart of creating a reference file containing a wire list between the interface connector and the wiring analyzer.

Referring to FIG. 5, the connector type of one of the connector 16 is entered in step 500. The connector type may be selected according to the format of the harness to be tested. In step 502, the name of the connector is entered. For example, for military application, the part number DB38999 is entered for the four connectors 16 as shown in FIGS. 1 and 3. In step 504, a grid pattern of the connector, for example, the rows and columns for the interface pins of the connector is entered. In step 506, each of the interface pins is labeled with a specific number. In step 508, the above information of the connector is stored in a database library. In step 510, the I/O connector is attached to the modular wiring analyzer boxes. In step 512, a wire list, that is, to which pin of the modular wiring analyzer boxes that each interface pin of the I/O connectors is connected, is obtained. Steps 500–512 are repeated until all the I/O connectors are installed. In this embodiment, four I/O connectors are installed with the reference names such as J1, J2, J3 and J4. In the above process, once a connector is selected to connect with the modular wiring analyzer boxes, the interface pin numbers of the selected connector are displayed on a screen. Via keyboard entry, the pin numbers of the modular wiring analyzer boxes wired to the interface pins of the I/O connectors are entered. Thereby, the pin numbers of the modular wiring analyzer boxes that are wired to the displayed interface pins of the selected connector can be obtained and displayed.

As mentioned above, when the cable or harness to be tested is connected to one or more of the connectors 16, the software file will perform a self-learning step. A software file "AWARef" comprising a wire-list of how each interface pin of the I/O connectors 16 is connected or attached to the base unit 12 and the add-on unit 14 is executed. When a new harness or cable is to be tested, a known-good harness of the same type of the new harness is hooked up to one or more of the connectors. The AWARef program is called up, and a wiring pattern of the known-good harness is automatically learned, displayed and stored as a test program with a file name referenced to the harness.

Referring to FIG. 4, a process flow of testing a new harness is illustrated. In step 400, when a new harness is to be tested, a known-good one of the new harness is hooked up to at least one of the I/O connectors. The AWARef file containing a list of the I/O connectors that are attached to the base unit and/or the add-on unit and a wire list of how each interface pin of the I/O connectors is connected to the system (the base unit or the add-on unit) is called up in step 402. In step 404, an edit mode is selected, such that the "learn wiring pattern" control is invoked to obtain the wiring pattern of the known-good harness. Consequently, the wiring pattern of the new harness to be tested is obtained. This control learns how the new cable or harness under test is connected to the I/O connectors defined in the AWARef file. In step 406, a test program for the new harness to be tested is automatically generated according to the wiring pattern. In step 408, one can directly attach the harness under test to at least one of the I/O connectors, and the test is executed automatically.

Accordingly, the present invention provides an automatic wiring analyzer that includes a plurality of I/O connectors and a self-programming test device. The test device is operative to identify the wire list of the I/O connectors, that is, how each interface pin of the I/O connectors is connected to the self-programming test device. More specifically, the wire list includes the information of which pin of the self-programming test device that each interface pin of the I/O connectors is connected to. The test device is also operative to identify which of the I/O connectors is connected to the harness under test, and to obtain a wiring pattern of the harness under test. A test sequence of the harness under test is automatically generated by an initializer, that is, the test program, of the self-programming test device according to the wire list of the I/O connectors and the wiring pattern of the harness under test.

Figure 6:
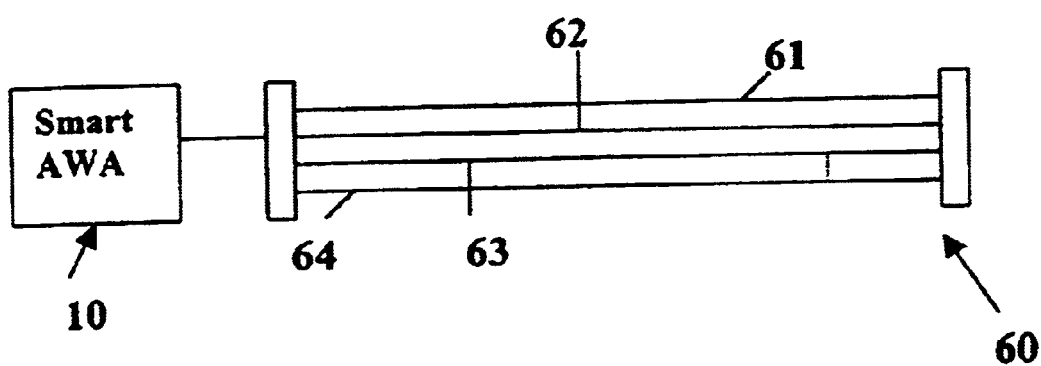
FIG. 6 shows the setup for testing short circuit by hooking up only one end of the cable.

In the prior art, when one performs a short circuit test on a cable, both ends of the cable have to be connected to the connector. One embodiment of the invention provides an easier way for this kind of test. As shown in FIG. 6, when a cable 60 with a plurality of wires 61, 62, 63, 64 are tested, only one end of the cable 60 is hooked up to the connectors. The method of testing the cable includes the following steps. A known-good reference cable of the same type or part number of the cable to be tested is connected to the smart automatic wiring analyzer. The AWARef file is called up at its edit mode. The AWARef file learns that there are all open circuit in the known-good cable. The information of all open circuit is stored as a test program which defines as all open circuit. The cable to be tested is then hooked up to the connector with one end thereof, should there occur any short circuit, for example, any abnormal connection between the wires 63 and 64, a path between the wires in the cable 60 will be created. The unexpected path will be displayed as a short circuit error.

By building the connectors in the system, the step of probing individual pin for each harness or cable under test is eliminated. With the elimination of an external harness board, the smart automatic wiring analyzer can be taken aboard in an aircraft to test and trouble-shoot the wiring of sub-system cables and harness. The smart AWA can be built with a small volume, for example, less than 1 cubit foot, and light weight, for example, about 241b. Further, by housing the system in a sealed military transit case and providing a shock absorber 18, the smart AWA is ruggedized. It can thus be operated in harsh environment such as sand, dust, salt-fog and fuel-rich environment. Filters and EMI gasketing 22 are employed to eliminate radiated emission that can set off ordinances or create sparks in a fuel-rich environment. Further, a specially designed transformer 20 that can operate at 60 Hz or 400 Hz is installed, so that the smart AWA can be used on military aircraft that requires a 400 Hz power.

Indeed, each of the features and embodiments described herein can be used by itself, or in combination with one or more of other features and embodiment. Thus, the invention is not limited by the illustrated embodiment but is to be defined by the following claims when read in the broadest reasonable manner to preserve the validity of the claims.

What is claimed is:

1. An automatic wiring analyzer for testing a first harness electrically attached to an electrical system, comprising:
   a. a plurality of I/O connectors, at least one of the I/O connectors being engageable to only one end of the harness; and
   b. a self-programming test unit comprising:
      i. a set of testing pins alternatively connectable to each of the I/O connectors; and
      ii. a test program being operative to identify the I/O connector that is connected to the set of testing pins, to establish a standard wiring pattern of a second harness, to determine a learned wiring pattern of the first harness, and to compare the standard wiring pattern of the second harness with the learned wiring pattern of the first harness while only one end of the first harness is connected to the I/O connector and the first harness is detached from the electrical system.

2. The automatic wiring analyzer as recited in claim 1, wherein a plurality of harness test sequences corresponding to a dedicated I/O connector are stored and a selected harness test sequence is implemented in response to identification of the dedicated I/O connector.

3. The automatic wiring analyzer as recited in claim 1, wherein the test program is further operative to identify a wire list of each I/O connector under investigation and is operative to generate and store a wiring test sequence corresponding to the wire list and the wiring pattern of the second harness.

4. The automatic wiring analyzer as recited in claim 1, further comprising a transformer that can operate at either 60 Hz or 400 Hz.

5. The automatic wiring analyzer as recited in claim 1, of which the volume is about 1 cubic foot.

6. The automatic wiring analyzer as recited in claim 1 further comprising a handle wherein, the weight of the analyzer is about 24 lb.

7. The automatic wiring analyzer as recited in claim 1, further comprising a military transit case to enclose the self-programming test unit.

8. The automatic wiring analyzer as recited in claim 1, further comprising a filter, an EMI gasketing and an explosion proof switch.

9. The automatic wiring analyzer as recited in claim 1, wherein the test unit is operative to performing short circuit test on the first harness while only one end of the first harness is connected to the I/O connector by predefining an all-open circuit information for the set of testing pins.

10. The automatic wiring analyzer as recited in claim 1, wherein each of the I/O connector comprises a set of interface pins connectable to the set of testing pins.

11. The automatic wiring analyzer as recited in claim 10, wherein the first harness comprises a plurality of wires connectable to the at least one I/O connectors.

12. A method of testing short circuited wires in a first harness, comprising:
   a. connecting only one end of the first harness to a wiring analyzer;
   b. establishing a standard wiring pattern of a second harness:
   c. determining a learned wiring pattern of the first harness: and
   d. comparing the standard wiring pattern of the second harness to the learned wiring pattern of the first harness.

13. The automatic wiring analyzer as recited in claim 12, further comprising the steps of:
   a. attaching one end of the second harness to the wiring analyzer before connecting the first harness thereto; and
   b. generating a test program according to the standard wiring pattern of the second harness.

14. The method as recited in claim 13, wherein the wiring analyzer comprises a plurality of I/O connectors and a self-programming test device which stores a wire list of the I/O connectors and a plurality of test programs.

15. The method as recited in claim 12, further comprising a step of predefining an all-open circuit information for the standard wiring pattern of the second harness.

16. The method as recited in claim 12, further comprising a step of detaching the harness under test from an electrical system.

* * * * *